US012808901B2

(12) United States Patent
Wang et al.

(10) Patent No.: US 12,808,901 B2
(45) Date of Patent: Nov. 24, 2026

(54) HIGH-QUALITY SIGNAL TRANSMISSION HIGH-FREQUENCY CONNECTION STRUCTURE BASED ON DOUBLE-FLOATING STRUCTURE

(71) Applicant: RESEARCH ON ELECTRICAL APPLIANCES OF SHANGHAI ASTRONAUTICS, Shanghai (CN)

(72) Inventors: Hongji Wang, Shanghai (CN); Qifeng Xu, Shanghai (CN); Lei Zhang, Shanghai (CN); Rumin Du, Shanghai (CN)

(73) Assignee: RESEARCH ON ELECTRICAL APPLIANCES OF SHANGHAI ASTRONAUTICS, Shanghai (CN)

( * ) Notice: Subject to any disclaimer, the term of this patent is extended or adjusted under 35 U.S.C. 154(b) by 139 days.

(21) Appl. No.: 18/852,521

(22) PCT Filed: Dec. 29, 2022

(86) PCT No.: PCT/CN2022/143336
§ 371 (c)(1),
(2) Date: Sep. 30, 2024

(87) PCT Pub. No.: WO2023/185164
PCT Pub. Date: Oct. 5, 2023

(65) Prior Publication Data

US 2025/0224424 A1 Jul. 10, 2025

(30) Foreign Application Priority Data

Mar. 31, 2022 (CN) ......................... 202210344748.8

(51) Int. Cl.
*G01R 1/067* (2006.01)

(52) U.S. Cl.
CPC ..... *G01R 1/06772* (2013.01); *G01R 1/06733* (2013.01)

(58) Field of Classification Search
CPC ......................... G01R 1/06772; G01R 1/06733
See application file for complete search history.

(56) References Cited

FOREIGN PATENT DOCUMENTS

| | | | | |
|---|---|---|---|---|
| CN | 1407661 A | * | 4/2003 | ............. H01R 24/50 |
| CN | 103176648 A | * | 6/2013 | ........... G06F 3/0443 |

(Continued)

OTHER PUBLICATIONS

International Search Report of PCT Patent Application No. PCT/CN2022/143336 issued on Mar. 2, 2023.

(Continued)

*Primary Examiner* — Minh Q Phan

(57) ABSTRACT

A double-floating-structure-based high-quality signal transmission high-frequency connection structure includes: a PCB board, wherein Pad(s) for transmitting a high-frequency signal is provided on the PCB board and includes high-frequency signal transmission area(s) and a grounding area formed outside the high-frequency signal transmission area(s), and a gap is formed between the high-frequency signal transmission area(s) and the grounding area; and a high-frequency signal transmission assembly in contact with the Pad of the PCB board and including an outer conductor assembly correspondingly in contact with the grounding area and an inner conductor assembly correspondingly in contact with the high-frequency signal transmission area, and the parts of the outer conductor assembly and the inner conductor assembly in contact with the PCB board have floating performance, such that the outer conductor assembly and the inner conductor assembly can be attached to the Pad at the same time.

16 Claims, 7 Drawing Sheets

(56) References Cited

FOREIGN PATENT DOCUMENTS

| | | | | | |
|---|---|---|---|---|---|
| CN | 105098542 | A | | 11/2015 | |
| CN | 111370953 | A | | 7/2020 | |
| JP | S58172879 | A | | 10/1983 | |
| JP | 2003086271 | A | | 3/2003 | |
| JP | 2006156207 | A | | 6/2006 | |
| JP | 2009016072 | A | | 1/2009 | |
| JP | 2015528192 | A | | 9/2015 | |
| KR | 101299071 | B1 | | 8/2013 | |
| KR | 102116888 | B1 | | 5/2020 | |
| KR | 102259074 | B1 | | 6/2021 | |
| KR | 20220013594 | A | | 2/2022 | |
| WO | WO-2019057376 | A1 | * | 3/2019 | ........... H01R 24/542 |

OTHER PUBLICATIONS

Written Opinion of PCT Patent Application No. PCT/CN2022/143336 issued on Mar. 2, 2023.

Patent Decision of counterpart Japanese Patent Application No. 2024-556008 issued Dec. 2, 2025.

Notice of Allowance of counterpart Korean Patent Application No. 10-2024-7033572 issued on May 11, 2026.

* cited by examiner

HIGH-QUALITY SIGNAL TRANSMISSION HIGH-FREQUENCY CONNECTION STRUCTURE BASED ON DOUBLE-FLOATING STRUCTURE

CROSS-REFERENCE TO RELATED APPLICATION

The present disclosure claims the priority to the Chinese patent application with the filing No. 202210344748.8 filed on Mar. 31, 2022 with the China National Intellectual Property Administration and entitled "HIGH-QUALITY SIGNAL TRANSMISSION HIGH-FREQUENCY CONNECTION STRUCTURE BASED ON DOUBLE-FLOATING STRUCTURE", the contents of which are incorporated herein by reference in entirety.

TECHNICAL FIELD

The present disclosure relates to the technical field of electrical component plugging, and particularly to a connector and a link for high-frequency signal transmission used in a chip testing device.

BACKGROUND ART

Chip test generally needs to realize transmission of signals through contact between a micropositioner (micromanipulator) (a fan-shaped structure in FIG. 1) and a PCB (a disk-shaped structure in FIG. 1), so as to test various parameters of chips, and judge specific performances of the chips. The micropositioner of a chip testing device has many ports, and the number of ports is usually defined according to testing requirements of chips. These ports are generally divided into high-frequency chip ports and low-frequency signal ports. Similarly, on a butt-joining end, the PCB, of these ports, there is also distributed a Pad (pad portion) in contact with high-frequency signals and low-frequency signals, as shown in FIG. 1.

In the related art, the chip testing device includes a PCB 1, a base 13, an upper cover 9, a plastic base seat 12, a low-frequency signal transmission assembly 10, a high-frequency signal transmission assembly 11, a low-frequency signal transmission cable 14 and a high-frequency signal transmission cable 15, as shown in FIG. 2.

In actual chip test, it is found that the high-frequency signal transmission assembly 11 generally does not adversely affect the high-frequency signals when a transmission rate does not exceed 2G, but once the transmission rate exceeds 2G, crosstalk and distortion will occur to the high-frequency signals.

SUMMARY

Regarding the shortcomings of relevant chip testing devices, the present disclosure provides a high-quality signal transmission high-frequency connection structure based on a double-floating structure, which solves the problems of crosstalk and distortion occurring to the high-frequency signals when the transmission rate of the high-frequency signal transmission assembly exceeds 2G. Specific technical solutions are as follows.

The high-frequency signal transmission assembly 11 of the relevant chip testing device has the following characteristics. As shown in FIG. 3, the high-frequency signal transmission assembly 11 is divided into an inner conductor 20 and an outer conductor 21. The outer conductor 21 is a fixed part without floating function, thus it is not in contact with the PCB 1 and is connected to adjacent low-frequency signal transmission assembly 10 through a grounding connection plate 22 to realize elastic contact with the PCB. The inventors discovered by accident that when a gap between the outer conductor 21 and the PCB is reduced, the transmitted high-frequency signals are improved to some extent. Researches and practices have proved that an air gap is generated between the outer conductor 21 and the PCB 1, and the generated air gap makes crosstalk and distortion occur to the high-frequency signals when the transmission rate exceeds 2G. One of the technical objectives of the present disclosure lies in eliminating the air gap so as to avoid its negative effect on the high-frequency signal transmission.

The high-quality signal transmission high-frequency connection structure based on a double-floating structure includes:

a PCB, wherein Pad(s) for transmitting a high-frequency signal is provided on the PCB, the Pad includes at least one high-frequency signal transmission area and a grounding area, wherein the grounding area is formed outside the high-frequency signal transmission area, and there is a gap between the high-frequency signal transmission area and the grounding area; and a high-frequency signal transmission assembly, wherein the high-frequency signal transmission assembly is in contact with the Pad of the PCB, the high-frequency signal transmission assembly includes an outer conductor assembly and an inner conductor assembly, the outer conductor assembly is in corresponding contact with the grounding area, the inner conductor assembly is in corresponding contact with the high-frequency signal transmission area, and parts of the outer conductor assembly and the inner conductor assembly in contact with the PCB have a floating performance, so as to enable the outer conductor assembly and the inner conductor assembly to be attached to the Pad simultaneously.

Optionally, the high-frequency signal transmission area may be a solid dot, and a gap between the high-frequency signal transmission area and the grounding area is a ring surrounding the outside of the high-frequency signal transmission area.

Optionally, the grounding area at least may have an inner boundary in a round shape or an arc shape concentric with the high-frequency signal transmission area.

Optionally, the grounding area may be in a four-leaf-clover shape or a diamond shape.

Optionally, high-frequency signal transmission areas are located on four branches of the four-leaf-clover shape or four corners of the diamond shape.

Optionally, the outer conductor assembly may include a support ring, a spring, a lower outer conductor, an upper outer conductor and a retainer ring, wherein the upper outer conductor is fixedly mounted at a terminal end of the lower outer conductor, the support ring is sleeved outside the upper outer conductor, the support ring can slide relative to the upper outer conductor in an axial direction, the spring is sleeved on an outer wall of the lower outer conductor and abuts against the support ring, and the other end of the spring is supported by a step surface provided on the outer wall of the lower outer conductor.

Optionally, an extended end of the upper outer conductor may be provided with a limiting flange radially protruding from the support ring.

Optionally, an end portion of the support ring may be provided with a step surface fitted with the limiting flange.

Optionally, the retainer ring may be provided between the support ring and the lower outer conductor.

Optionally, the inner conductor assembly may include a pin, a small spring, a metal inner shell and a metal outer shell, wherein the pin presses the small spring into the metal inner shell to form a combined part being installed in the metal outer shell, and a head portion of the pin extends out of the metal inner shell and realizes axial floating through the small spring.

Optionally, the inner conductor assembly may be a pogo pin, and the pogo pin is in contact with the PCB by an elastic force of the pin.

Optionally, an insulating medium may be provided between the inner conductor assembly and the outer conductor assembly.

Optionally, the inner conductor assembly and the outer conductor assembly may be both floating structures, with a floating direction being an axial direction of the high-frequency signal transmission assembly.

The present disclosure has the following beneficial effects: (1) the present disclosure can make a high-frequency port of the chip testing device transmit 20 G of high-frequency signals, and ensure a high-frequency signal transmission quality to be equivalent to that of the same type of radio frequency connector, such chip testing device is connected to the Pad of the PCB through an elastic contact, the number of ports is not limited, and density of the ports can reach about 2 mm; (2) the present disclosure adds a function of floating of the outer conductor of the high-frequency signal transmission port, and the shape of the Pad on the PCB in contact with the high-frequency port is improved, so that the inner and outer conductors of the high-frequency port can both be in elastic contact with the PCB, thus making grounding, shielding and signal transmission of the high-frequency port to be simultaneously realized, improving a condition of the high-frequency signal transmission, eliminating the air gap of the high-frequency transmission link, avoiding the distortion and energy loss of the signals, making a high-frequency signal transmission rate reach 20 Gbps or higher, improving usability of the device, increasing application scenarios of the device, indirectly shortening upgrading time of the device, and greatly improving the utilization rate of the device; and (3) the present disclosure also realizes that it is convenient to replace the inner conductor of the high-frequency port and the contact of the low-frequency port, the problem that the contact cannot be replaced and is hard to maintain when the contact is failed due to damage, wear caused by repeated use, and environment corrosion, a maintenance time is greatly shortened, a maintenance cost is reduced, and a service life of the device is prolonged.

Figure 1:
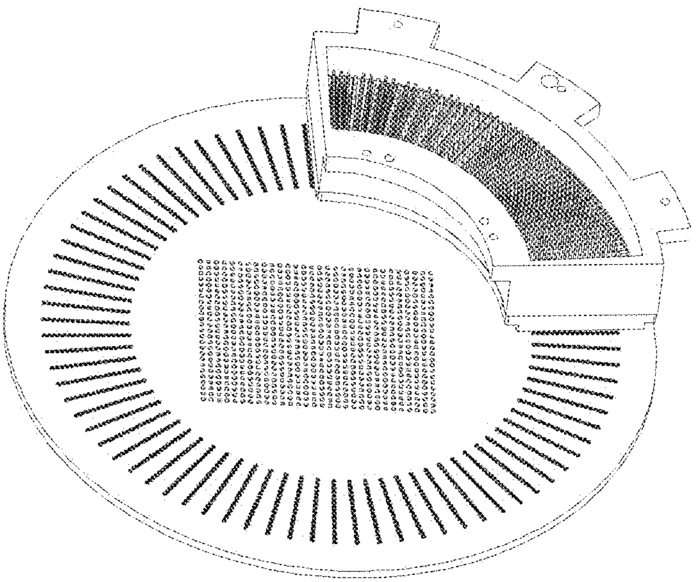
FIG. 1 is a structural schematic diagram of a micropositioner fitting with a PCB in the related art.
Figure 2:
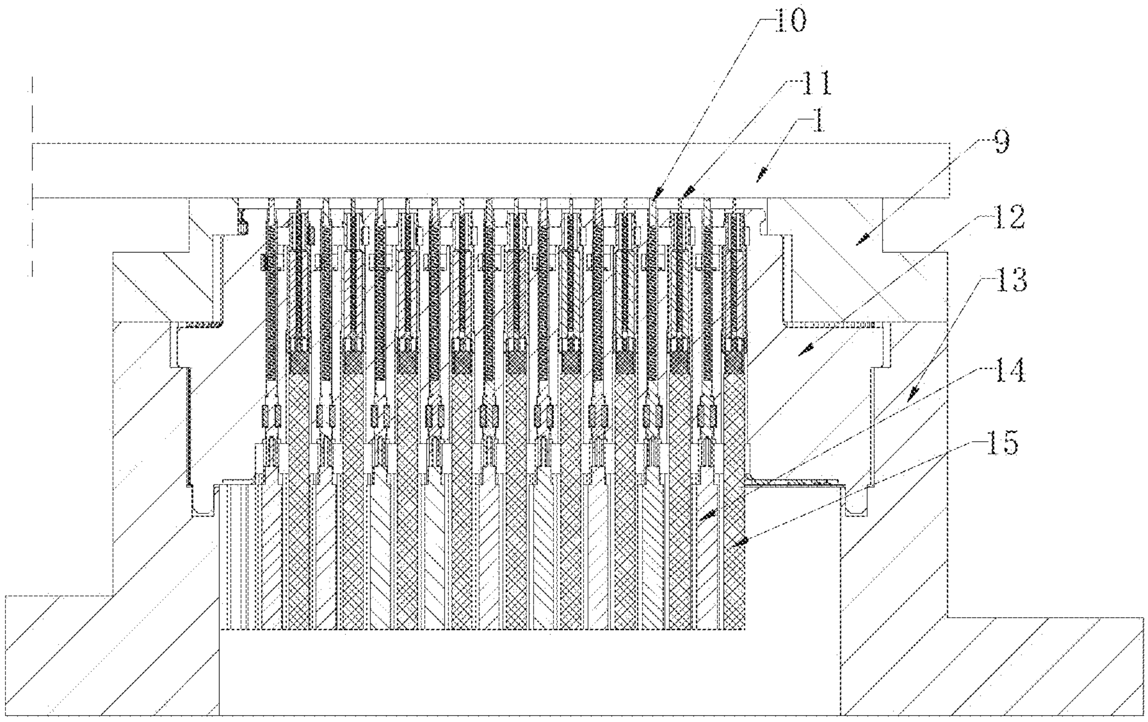
FIG. 2 is a schematic diagram of an overall structure of a chip testing device in the prior art.
Figure 3:
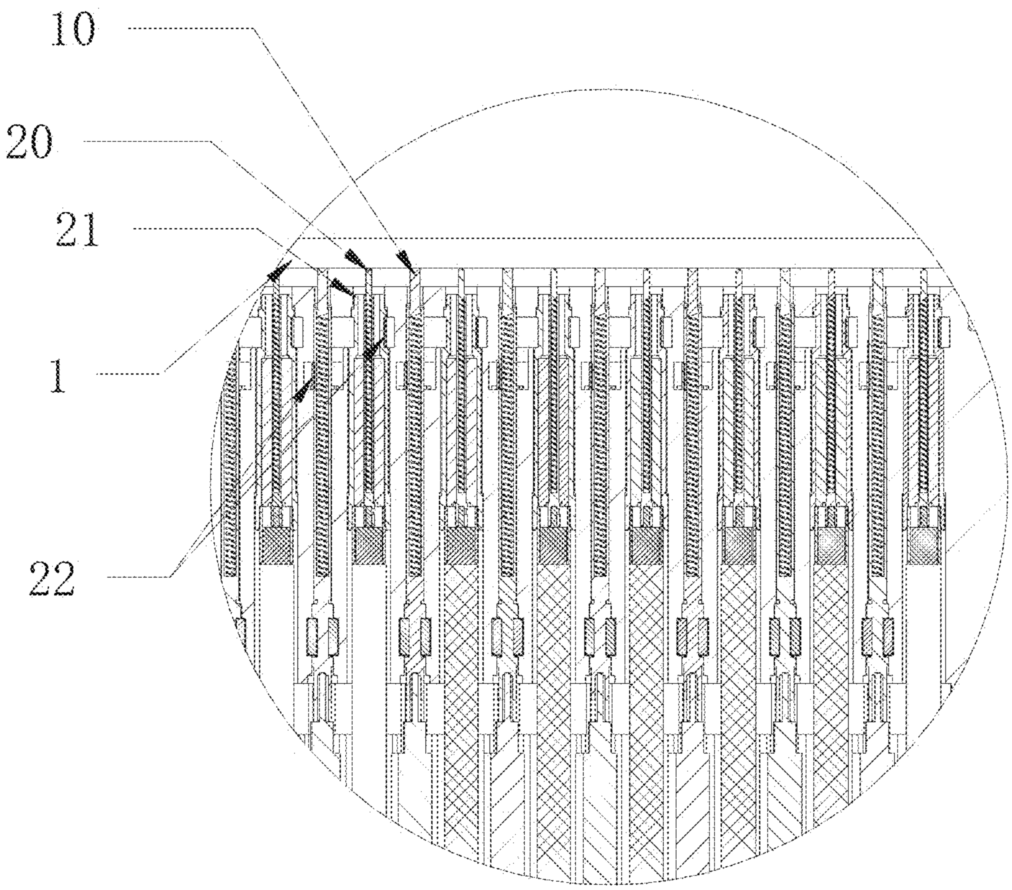
FIG. 3 is a structural schematic diagram of a high-frequency signal transmission assembly of the chip testing device in the prior art.

In the drawings: PCB 1, transmission area 6, grounding area 7, upper cover 9, low-frequency signal transmission assembly 10, high-frequency signal transmission assembly 11, plastic base seat 12, base 13, low-frequency signal transmission cable 14, high-frequency signal transmission cable 15, outer conductor assembly 16, inner conductor assembly 17, inner conductor 20, outer conductor 21, grounding connection plate 22, support ring 23, spring 24, lower outer conductor 25, upper outer conductor 26, retainer ring 27, pin 29, small spring 30, metal inner shell 31, metal outer shell 32

DETAILED DESCRIPTION OF EMBODIMENTS

In order to make the objectives, technical solutions and advantages of the embodiments of the present disclosure clearer, the technical solutions of the present disclosure will be clearly and completely described below in conjunction with the embodiments.

EMBODIMENTS

In the present embodiment, a connection structure of a PCB 1 and a high-frequency signal transmission assembly 11 is re-designed to solve the above problems of crosstalk and distortion of high-frequency signals, including two following parts.

Figure 9:
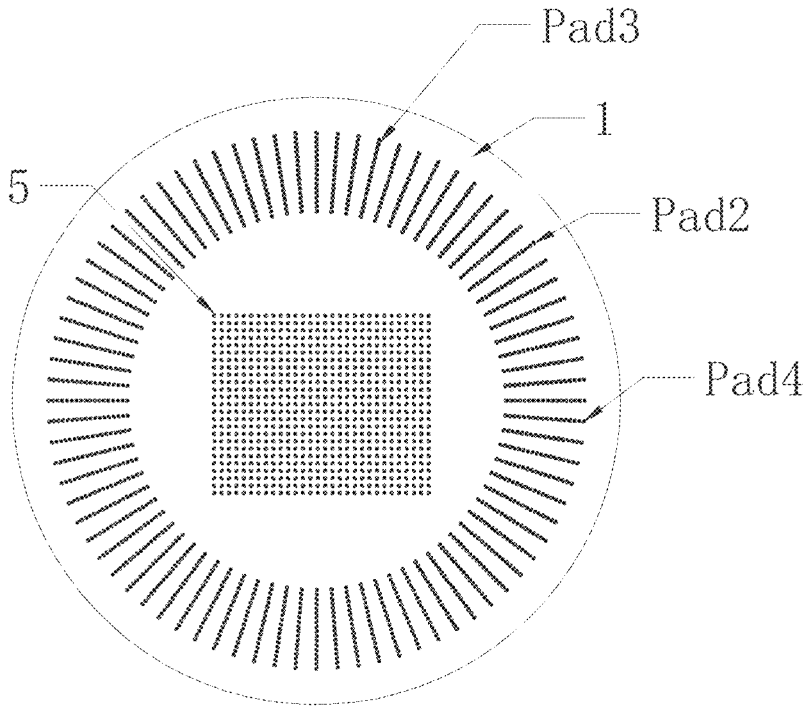
FIG. 9 is a structural schematic diagram of the PCB 1.

A first part is a Pad distributed on the PCB 1 and in contact with the high-frequency signal transmission assembly 11. The PCB 1 mainly includes two types: a round type and a rectangular type. FIG. 1 shows a round PCB 1. The number of layers of the PCB 1 is designed according to use requirements. The Pad is distributed on the PCB and in contact with a low-frequency signal transmission assembly 10 and the high-frequency signal transmission assembly 11 which are butt-joined thereto, so as to implement signal transmission. As shown in FIG. 9, it is a structural schematic diagram of the PCB 1, on which PCB 1, contact Pads 2 and welding via positions 5 are distributed, wherein the contact Pads 2 are divided into high-frequency transmission Pads 3 and low-frequency transmission Pads 4, which are respectively in contact with the high-frequency signal transmission assembly 11 and the low-frequency signal transmission assembly 10, and the welding via positions 5 are corresponding to the contact Pads 2 one by one for connecting cables or other connectors and outputting signals.

Figure 4:
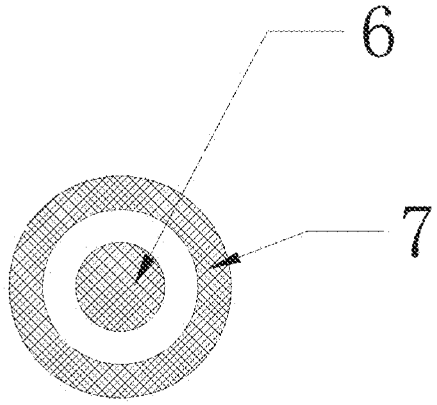
FIG. 4 is a schematic diagram of a shape of a Pad on a PCB in contact with a high-frequency signal transmission assembly 11 in embodiments of the present disclosure.

As shown in FIG. 4, it is a schematic diagram of a shape of the Pad on the PCB 1 in contact with the high-frequency signal transmission assembly 11 in the present embodiment. This Pad includes a high-frequency signal transmission area 6 and a grounding area 7, wherein the grounding area 7 is formed outside the high-frequency signal transmission area 6, and there is a gap between the high-frequency signal transmission area 6 and the grounding area 7. This high-frequency signal transmission area 6 is a solid dot, with a diameter thereof being determined according to a diameter of a pin of the high-frequency signal transmission assembly 11. The grounding area 7 is a circular ring, of which a width is determined according to a size of an outer conductor assembly 16 of the high-frequency signal transmission assembly 11 in contact with the circular ring. The outer conductor assembly 16 of the high-frequency signal transmission assembly 11 is in contact with the grounding area 7 to implement shielding and grounding functions, and an inner conductor assembly 17 of the high-frequency signal transmission assembly 11 is in contact with the high-frequency signal transmission area 6 to implement a function of transmitting the high-frequency signals.

Figure 5:
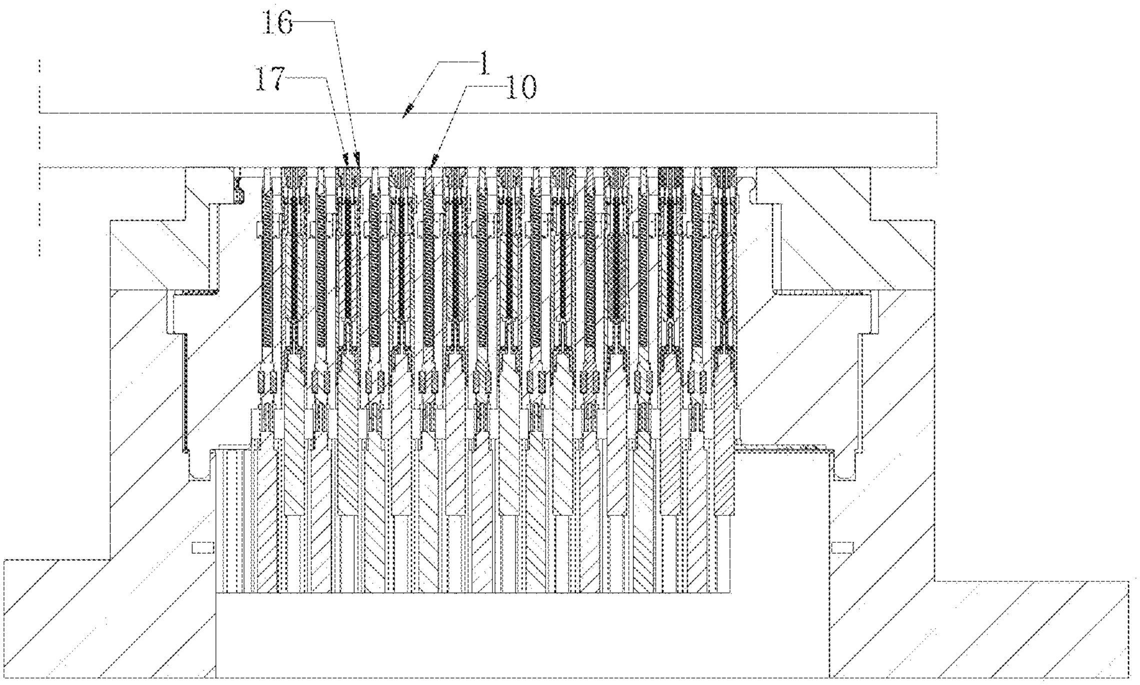
FIG. 5 is a schematic diagram of the high-frequency signal transmission assembly fitting with the PCB in the embodiments of the present disclosure.

A second part is the high-frequency signal transmission assembly 11 corresponding to the Pad. As shown in FIG. 5, the high-frequency signal transmission assembly 11 includes the outer conductor assembly 16 and an inner conductor assembly 17, wherein the outer conductor assembly 16 and the inner conductor assembly 17 are both floating structures, with a floating direction being an axial direction of the high-frequency signal transmission assembly 11, and the outer conductor assembly 16 is in contact with the PCB 1 by an elastic force provided by a spring, and the inner conductor assembly 17 is a pogo pin and is in contact with the PCB 1 by an elastic force of the pin. Floating ranges of the outer conductor assembly 16 and the inner conductor assembly 17 are designed according to practical requirements.

Figure 6:
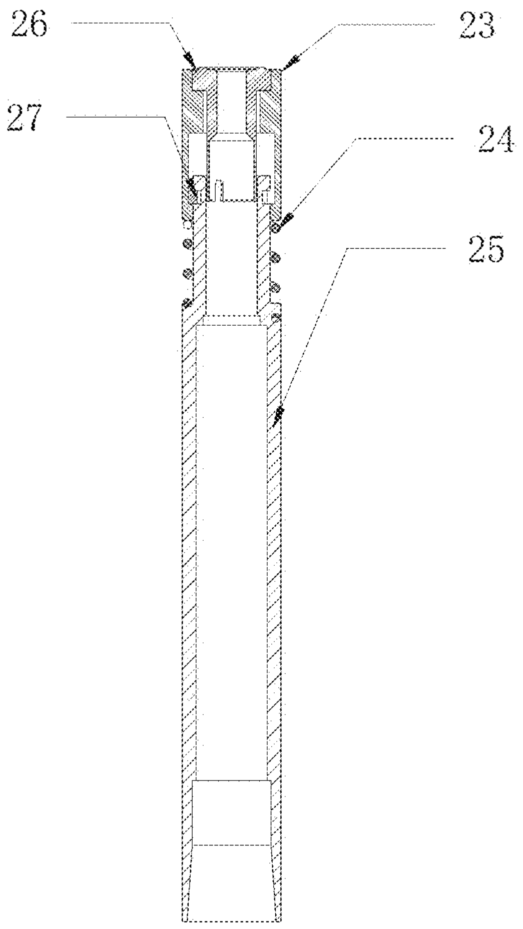
FIG. 6 is a structural schematic diagram of an outer conductor assembly 1 in the embodiments of the present disclosure.

FIG. 6 illustrates a structure of the outer conductor assembly 16 in detail. The outer conductor assembly 16 includes a support ring 23, a spring 24, a lower outer conductor 25, an upper outer conductor 26 and a retainer ring 27. The upper outer conductor 26 is mounted at a top end of the lower outer conductor 25 and the upper outer conductor 26 is in elastic contact with the lower outer conductor 25. The support ring 23 is sleeved outside the upper outer conductor 26 and the support ring 23 can slide relative to the upper outer conductor 2 in an axial direction. The spring 24 is sleeved over an outer wall of the lower outer conductor 25 and abuts against the support ring 23, and the other end of the spring 24 is supported by a step surface provided on the outer wall of the lower outer conductor 25. An extended end of the upper outer conductor 26 is provided with a flange radially protruding. An end portion of the support ring 23 is provided with a step surface fitted with the flange, so that the upper outer conductor 26 is pushed to a topmost position by the support ring 23. Meanwhile, the retainer ring 27 is added between the support ring 23 and the lower outer conductor 25, so as to prevent the support ring 23 from sliding out of the lower outer conductor 25. A flange is designed on a bottom side surface of the upper outer conductor 26 to be in elastic contact with an inner round surface of the lower outer conductor 25. In order to ensure the elastic contact, two slots are provided on the bottom side surface of the upper outer conductor 26.

Figure 7:
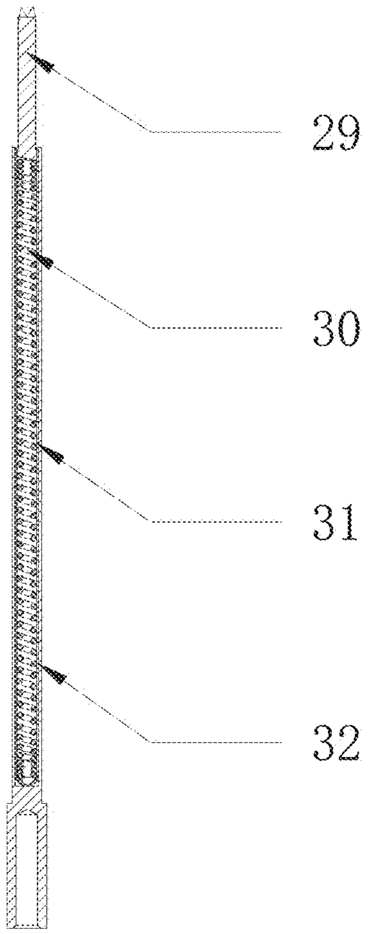
FIG. 7 is a structural schematic diagram of an inner conductor assembly 1 in the embodiments of the present disclosure.

FIG. 7 illustrates a structure of the inner conductor assembly 17 in detail. The inner conductor assembly 17 includes a pin 29, a small spring 30, a metal inner shell 31 and a metal outer shell 32, wherein the pin 29 presses the small spring 30 into the metal inner shell 31 to form a combined part integrally installed in the metal outer shell 32. A head portion of the pin 29 extends out of the metal inner shell 31 and realizes axial floating through the small spring 30. When contact of the pin is unreliable due to damage or wear in use, it can be pulled out of the metal outer shell 32 and replaced, which is convenient for maintenance and prolongs the service life of the inner conductor.

Figure 8:
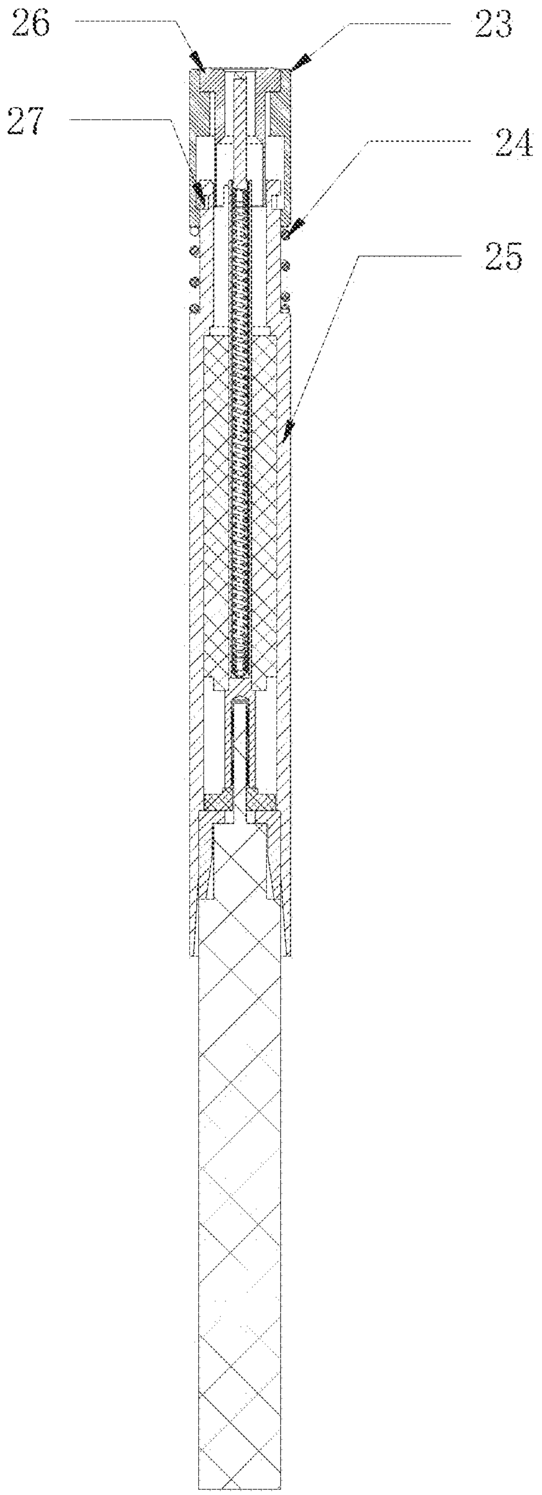
FIG. 8 is a schematic diagram of an overall structure of the high-frequency signal transmission assembly in the embodiments of the present disclosure.

As shown in FIG. 8, it is a structural schematic diagram after the inner conductor assembly 17 and the outer conductor assembly 16 are assembled. In an assembling process, an insulating medium is provided between the metal outer shell 32 and the lower outer conductor 25, so as to achieve an insulation effect.

Figure 10:
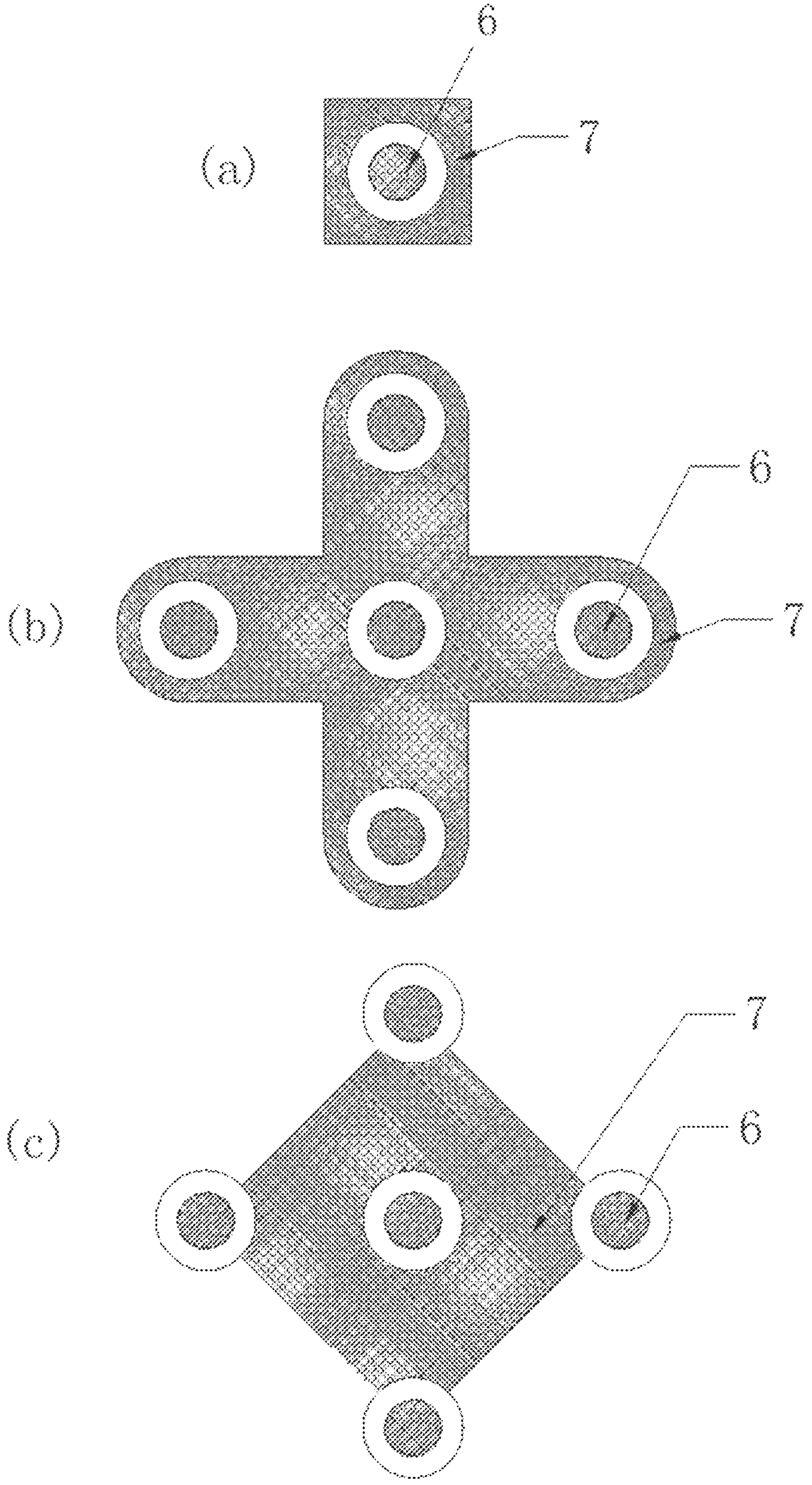
FIG. 10 shows other shapes of Pads on the PCB in contact with the high-frequency signal transmission assembly 11 in the embodiments of the present disclosure.

As shown in FIG. 10, they are respectively other shapes of the Pads on the PCB 1 in contact with the high-frequency signal transmission assembly 11. In (a), the high-frequency signal transmission area 6 is a solid dot, an inner boundary of the grounding area 7 is in a circular shape which is concentric with the high-frequency signal transmission area 6, and an outer boundary thereof is in a rectangular shape, especially in a square shape; in (b), the high-frequency signal transmission areas 6 are solid dots, the inner boundaries of the grounding area 7 are in a circular shape which is concentric with corresponding high-frequency signal transmission areas 6, the grounding area 7 is in a four-leaf-clover shape on the whole, and the high-frequency signal transmission areas 6 are located on four branches of the four-leaf-clover shape; and in (c), the high-frequency signal transmission areas 6 are solid dots, the inner boundaries of the grounding area 7 are in a circular shape which is concentric with corresponding high-frequency signal transmission areas 6, the grounding area 7 is in a diamond shape on the whole, and the high-frequency signal transmission areas 6 are located at four corners and center of the diamond shape. In addition, it should also be noted that the shapes of and positional relationships between the high-frequency signal transmission area 6 and the grounding area 7, especially the shape of the grounding area 7, are not limited thereto, as long as the outer conductor assembly 16 of the high-frequency signal transmission assembly 11 is ensured to communicate with the grounding area 7.

The above embodiments are merely used to illustrate the technical solutions of the present disclosure, but do not limit the same.

INDUSTRIAL APPLICABILITY

The high-quality signal transmission high-frequency connection structure based on a double-floating structure provided in the present disclosure has the following beneficial effects: (1) the high-frequency port of the chip testing device can be enabled to transmit 20 G of high-frequency signals, the high-frequency signal transmission quality is ensured to be equivalent to that of the same type of radio frequency connector, such chip testing device is connected to the Pads of the PCB through the elastic contacts, the number of ports is not limited, and the density of the ports can reach about 2 mm; (2) the function of floating of the outer conductor of the high-frequency signal transmission port is added, and the shape of the Pads on the PCB in contact with the high-frequency port is improved, so that the inner and outer conductors of the high-frequency port can both be in elastic contact with the PCB, thus making the grounding, shielding and signal transmission of the high-frequency port to be simultaneously realized, improving the condition of the high-frequency signal transmission, eliminating the air gap of the high-frequency transmission link, avoiding the distortion and energy loss of the signals, making the high-frequency signal transmission rate reach 20 Gbps or higher, improving the usability of the device, increasing application scenarios of the device, indirectly shortening upgrading time of the device, and greatly improving the utilization rate of the device; and (3) it is also convenient to replace the inner conductor of the high-frequency port and the contact of the low-frequency port, the problem that the contact cannot be replaced and is hard to maintain when contact is failed due to damage, wear caused by repeated use, and environment corrosion, the maintenance time is greatly shortened, the maintenance cost is reduced, and the service life of the device is prolonged.

Besides, it may be understood that the high-quality signal transmission high-frequency connection structure based on a double-floating structure of the present disclosure can be reproduced, and can be used in a variety of industrial applications. For example, the high-quality signal transmission high-frequency connection structure based on a double-floating structure of the present disclosure can be used in the technical field of electrical component plugging.

The invention claimed is:

1. A high-quality signal transmission high-frequency connection structure based on a double-floating structure, comprising:

a PCB (Printed Circuit Board), wherein a pad configured for transmitting a high-frequency signal is provided on the PCB, the pad comprises at least one high-frequency signal transmission area and a grounding area, wherein the grounding area is formed outside the at least one high-frequency signal transmission area, and a gap is formed between the at least one high-frequency signal transmission area and the grounding area;

a high-frequency signal transmission assembly, wherein the high-frequency signal transmission assembly is in contact with the pad of the PCB, the high-frequency signal transmission assembly comprises an outer conductor assembly and an inner conductor assembly, the outer conductor assembly is in corresponding contact with the grounding area, the inner conductor assembly is in corresponding contact with the at least one high-frequency signal transmission area, and parts of the outer conductor assembly and the inner conductor assembly in contact with the PCB have a floating performance, so as to enable the outer conductor assembly and the inner conductor assembly to be both attached to the pad;

wherein the outer conductor assembly comprises a support ring, a spring, a lower outer conductor, an upper outer conductor and a retainer ring, wherein the upper outer conductor is fixedly mounted at a terminal end of the lower outer conductor, the support ring is sleeved outside the upper outer conductor, the support ring is configured to slide relative to the upper outer conductor in an axial direction, the spring is sleeved over an outer wall of the lower outer conductor and abuts against the support ring, and the other end of the spring is supported by a step surface provided on the outer wall of the lower outer conductor.

2. The high-quality signal transmission high-frequency connection structure based on a double-floating structure according to claim 1, wherein the at least one high-frequency signal transmission area is a solid dot, and the gap between the at least one high-frequency signal transmission area and the grounding area is a ring surrounding an outside of the at least one high-frequency signal transmission area.

3. The high-quality signal transmission high-frequency connection structure based on a double-floating structure according to claim 1, wherein the grounding area at least has an inner boundary in a round shape or an arc shape concentric with the at least one high-frequency signal transmission area.

4. The high-quality signal transmission high-frequency connection structure based on a double-floating structure according to claim 1, wherein the grounding area is in a four-leaf-clover shape or a diamond shape.

5. The high-quality signal transmission high-frequency connection structure based on a double-floating structure according to claim 4, wherein high-frequency signal transmission areas are located on four branches of the four-leaf-clover shape or four corners of the diamond shape.

6. The high-quality signal transmission high-frequency connection structure based on a double-floating structure according to claim 1, wherein an extended end of the upper outer conductor is provided with a limiting flange radially protruding from the support ring.

7. The high-quality signal transmission high-frequency connection structure based on a double-floating structure according to claim 6, wherein an end portion of the support ring is provided with a step surface fitted with the limiting flange.

8. The high-quality signal transmission high-frequency connection structure based on a double-floating structure according to claim 1, wherein the retainer ring is provided between the support ring and the lower outer conductor.

9. The high-quality signal transmission high-frequency connection structure based on a double-floating structure according to claim 1, wherein a bottom side surface of the upper outer conductor is provided with a flange in elastic contact with an inner round surface of the lower outer conductor, and the bottom side surface of the upper outer conductor is provided with two slots.

10. The high-quality signal transmission high-frequency connection structure based on a double-floating structure according to claim 1, wherein the inner conductor assembly comprises a pin, a small spring, a metal inner shell and a metal outer shell (32), wherein the pin presses the small spring into the metal inner shell to form a combined part which is installed in the metal outer shell (32), and a head portion of the pin extends out of the metal inner shell and is configured to realize axial floating through the small spring.

11. The high-quality signal transmission high-frequency connection structure based on a double-floating structure according to claim 1, wherein the inner conductor assembly is a pogo pin, and the pogo pin is in contact with the PCB by an elastic force of the pin.

12. The high-quality signal transmission high-frequency connection structure based on a double-floating structure according to claim 1, wherein an insulating medium is provided between the inner conductor assembly and the outer conductor assembly.

13. The high-quality signal transmission high-frequency connection structure based on a double-floating structure according to claim 1, wherein the inner conductor assembly and the outer conductor assembly are both floating structures, with a floating direction being an axial direction of the high-frequency signal transmission assembly.

14. The high-quality signal transmission high-frequency connection structure based on a double-floating structure according to claim 2, wherein the grounding area at least has an inner boundary in a round shape or an arc shape concentric with the at least one high-frequency signal transmission area.

15. The high-quality signal transmission high-frequency connection structure based on a double-floating structure according to claim 2, wherein the inner conductor assembly comprises a pin, a small spring, a metal inner shell and a metal outer shell, wherein the pin presses the small spring into the metal inner shell to form a combined part which is installed in the metal outer shell, and a head portion of the pin extends out of the metal inner shell and is configured to realize axial floating through the small spring.

16. The high-quality signal transmission high-frequency connection structure based on a double-floating structure according to claim 2, wherein the inner conductor assembly is a pogo pin, and the pogo pin is in contact with the PCB by an elastic force of the pin.

* * * * *